(12) United States Patent
Tsai et al.

(10) Patent No.: US 12,446,240 B2
(45) Date of Patent: Oct. 14, 2025

(54) INTERCONNECT LAYOUT FOR SEMICONDUCTOR DEVICE

(71) Applicant: Taiwan Semiconductor Manufacturing Co., Ltd., Hsinchu (TW)

(72) Inventors: Chun-Hsiung Tsai, Xinpu Township (TW); Shahaji B. More, Hsinchu (TW); Yu-Ming Lin, Hsinchu (TW); Clement Hsingjen Wann, Carmel, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/585,211

(22) Filed: Feb. 23, 2024

(65) Prior Publication Data

US 2024/0194730 A1  Jun. 13, 2024

Related U.S. Application Data

(63) Continuation of application No. 17/549,389, filed on Dec. 13, 2021, now Pat. No. 11,961,878, which is a
(Continued)

(51) Int. Cl.
*H01L 23/528* (2006.01)
*H01L 23/00* (2006.01)
(Continued)

(52) U.S. Cl.
CPC ......... *H10D 1/692* (2025.01); *H01L 23/5226* (2013.01); *H01L 23/528* (2013.01);
(Continued)

(58) Field of Classification Search
CPC ..... H10B 12/038; H10B 12/37; H10F 39/811; H05K 5/13; H01L 23/5226; H01L 23/528;
(Continued)

(56) References Cited

U.S. PATENT DOCUMENTS 6,537,849 B1  3/2003  Tsai et al.
7,053,453 B2  5/2006  Tsao et al.
(Continued)

FOREIGN PATENT DOCUMENTS

CN  102832204 A  12/2012
CN  105047627 A  11/2015
(Continued)

OTHER PUBLICATIONS

Pei, C. et al., "A Novel, Low-Cost Deep Trench Decoupling Capacitor for High-Performance, Low-Power Bulk CMOS Application," 2008 9th International Conference on Solid-State and Integrated-Circuit Technology, Oct. 20-23, 2008, 4 pages, Beijing, China.

*Primary Examiner* — Galina G Yushina
(74) *Attorney, Agent, or Firm* — Slater Matsil, LLP

(57) ABSTRACT

A semiconductor device and a method of forming the same are provided. The semiconductor device includes a substrate, a deep trench capacitor (DTC) having a portion within the substrate, and an interconnect structure over the DTC and the substrate. The interconnect structure includes a seal ring structure in electrical contact with the substrate, a first conductive via in electrical contact with the DTC, and a first conductive line electrically coupling the seal ring structure to the first conductive via.

20 Claims, 10 Drawing Sheets

Related U.S. Application Data continuation of application No. 16/738,095, filed on Jan. 9, 2020, now Pat. No. 11,201,205.

(60) Provisional application No. 62/880,753, filed on Jul. 31, 2019.

(51) Int. Cl.

| | | |
|---|---|---|
| *H01L 23/522* | (2006.01) | |
| *H10B 12/00* | (2023.01) | |
| *H10D 1/66* | (2025.01) | |
| *H10D 1/68* | (2025.01) | |
| *H10F 39/00* | (2025.01) | |

(52) U.S. Cl.
CPC .............. *H01L 24/18* (2013.01); *H01L 24/25* (2013.01); *H10B 12/038* (2023.02); *H10B 12/37* (2023.02); *H10D 1/665* (2025.01); *H10F 39/811* (2025.01); *H01L 2224/821* (2013.01)

(58) Field of Classification Search
CPC ... H01L 24/18; H01L 24/25; H01L 2224/821; H01L 24/03; H01L 24/05; H01L 24/11; H01L 24/13; H01L 2224/0345; H01L 2224/03462; H10D 1/716; H10D 1/60; H10D 1/042; H10D 1/665; H10D 1/692
See application file for complete search history.

(56) References Cited

U.S. PATENT DOCUMENTS

| | | | |
|---|---|---|---|
| 7,550,850 B2 | 6/2009 | Nakashiba | |
| 7,898,056 B1 | 3/2011 | Keramat et al. | |
| 8,283,754 B2 | 10/2012 | Lin et al. | |
| 9,023,688 B1 | 5/2015 | Or-Bach et al. | |
| 2004/0108587 A1 | 6/2004 | Chudzik et al. | |
| 2006/0102980 A1 | 5/2006 | Nakashiba | |
| 2011/0169131 A1 | 7/2011 | Nokos et al. | |
| 2012/0193760 A1 | 8/2012 | Manabe et al. | |
| 2012/0313217 A1* | 12/2012 | Hung .................... | H01L 23/585 257/532 |
| 2013/0161792 A1* | 6/2013 | Tran ........................ | H10D 1/62 438/386 |
| 2014/0070366 A1 | 3/2014 | Yen et al. | |
| 2015/0303191 A1 | 10/2015 | Feng et al. | |
| 2015/0311140 A1 | 10/2015 | Kalnitsky et al. | |
| 2016/0020267 A1* | 1/2016 | Lin ........................ | H10D 1/042 257/532 |
| 2016/0379999 A1 | 12/2016 | Chou et al. | |
| 2017/0033112 A1 | 2/2017 | Cheng et al. | |
| 2017/0141052 A1* | 5/2017 | Pan ........................ | H01L 23/564 |
| 2018/0076276 A1* | 3/2018 | Chou ...................... | H10D 1/68 |
| 2018/0090558 A1 | 3/2018 | Zaka et al. | |
| 2018/0122781 A1* | 5/2018 | Chen ...................... | H01L 24/29 |
| 2018/0138113 A1 | 5/2018 | Chen et al. | |
| 2018/0277518 A1 | 9/2018 | Iida et al. | |
| 2018/0286824 A1* | 10/2018 | Jeng ...................... | H01L 21/6835 |
| 2019/0006334 A1 | 1/2019 | Gardner et al. | |
| 2019/0067274 A1* | 2/2019 | Marzaki ................ | H01L 21/283 |

FOREIGN PATENT DOCUMENTS

| | | |
|---|---|---|
| CN | 106409812 A | 2/2017 |
| TW | 201242013 A | 10/2012 |
| TW | 201246387 A | 11/2012 |
| TW | 201612980 A | 4/2016 |
| TW | 201729388 A | 8/2017 |
| TW | 201814912 A | 4/2018 |
| TW | 201834174 A | 9/2018 |
| TW | 201838127 A | 10/2018 |

\* cited by examiner

INTERCONNECT LAYOUT FOR SEMICONDUCTOR DEVICE

PRIORITY CLAIM AND CROSS-REFERENCE

This application is a continuation of U.S. application Ser. No. 17/549,389, filed on Dec. 13, 2021, now U.S. Pat. No. 11,961,878, issued Apr. 16, 2024, which is a continuation of U.S. application Ser. No. 16/738,095, filed on Jan. 9, 2020, now U.S. Pat. No. 11,201,205 issued Dec. 14, 2021, which claims the benefit of U.S. Provisional Application No. 62/880,753, filed on Jul. 31, 2019, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
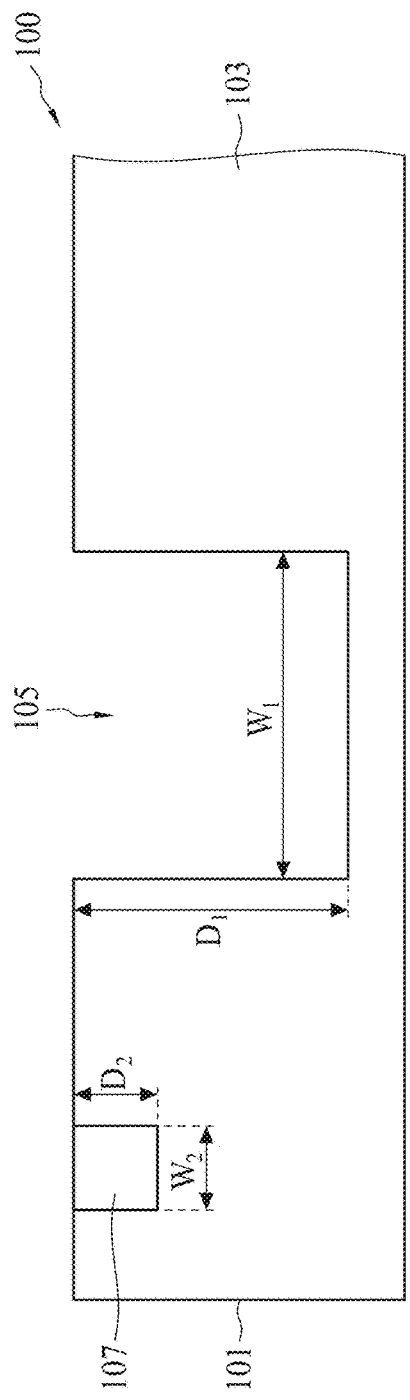
FIGS. 1-7 illustrate cross-sectional views of various intermediate stages of fabrication of a semiconductor device wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, an interconnect structure layout of a semiconductor device. The semiconductor device may be an integrated passive device (IPD) comprising deep trench capacitors (DTCs). However, embodiments discussed herein may also be applied to other semiconductor devices, such as planar CMOS devices, FinFET devices, or the like. Various embodiments discussed herein allow for avoiding burn-out and circuit short of various components (such as, for example, DTCs) of a semiconductor device due to plasma arcing during a deposition step for forming under bump metallizations (UBMs). Furthermore, various embodiments discussed herein allow for increasing the capacitor density and improving semiconductor device yield.

FIGS. 1-7 illustrate cross-sectional views of various intermediate stages of fabrication of a semiconductor device wafer 100 in accordance with some embodiments. FIG. 1 illustrates a cross-sectional view of an edge portion of the semiconductor device wafer 100, with a sidewall 101 being the edge of the semiconductor device wafer 100. In some embodiments, the semiconductor device wafer 100 comprises a substrate 103. The substrate 103 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 103 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more recesses 105 (illustrated by a single recess 105 in FIG. 1) are formed in the substrate 103. In some embodiments, the substrate 103 may be patterned using suitable photolithography and etching methods to form the recesses 105. For example, a photoresist (not shown) may be formed and patterned over the substrate 103, and one or more etching processes (e.g., a dry etch process) may be utilized to remove those portions of the substrate 103 where the recesses 105 are desired. In some embodiments, the recesses 105 may have a width $W_1$ between about 100 nm and about 1000 nm. In some embodiments, the recesses 105 may have a depth $D_1$ between about 1000 nm and about 5000 nm. In some embodiments, a ratio $W_1/D_1$ is between about 0.2 and about 1. As described below in greater detail deep trench capacitors (DTCs) are partially formed in the recesses 105.

In some embodiments, one or more doped regions 107 (illustrated by a single doped region 107 in FIG. 1) are formed in the substrate 103. A doped region 107 may be formed using implantation, thermal diffusion, a combination thereof, or the like. In some embodiments, the doped region 107 is formed by implanting arsenic (As) or phosphorus (P) in the substrate 103. In some embodiments, a dosage of the implants is between about 1E13 ions/cm$^2$ and about 1E15 ions/cm$^2$. In some embodiments, the implantation energy is between about 1 KeV and about 10 KeV. In some embodiments, a width $W_2$ of the doped region 107 is between about 50 nm and about 500 nm. In some embodiments, a depth $D_2$ of the doped region 107 is between about 10 nm and about 100 nm. In some embodiments, a ratio $W_2/D_2$ is between about 0.5 and about 50. In some embodiments, the one or more doped regions 107 are formed after forming the one or more recesses 105. In other embodiments, the one or more doped regions 107 are partially formed before forming the one or more recesses 105. As described below in greater detail, the doped region 107 is formed at an interface between the substrate 103 and a subsequently formed seal ring (SR) structure. The doped region 107 reduces the resistivity of the substrate 103 and reduces or eliminates charge build-up at the interface between the substrate 103 and the seal ring (SR) structure.

Figure 2:
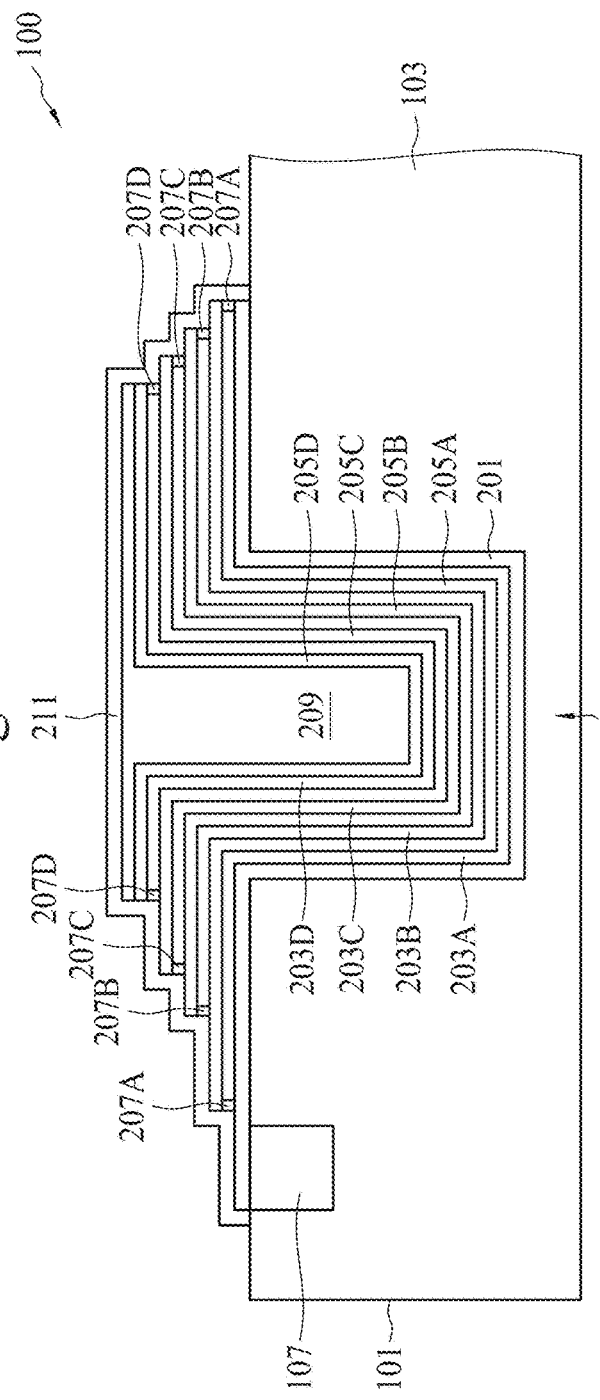

Referring to FIG. 2, a DTC 213 is partially formed in the recess 105 (see FIG. 1). In some embodiments, a liner layer 201 is formed over the substrate 103 and along sidewalls and a bottom of the recess 105. In some embodiments, the liner layer 201 may comprise a dielectric material, such as silicon oxide, SiON, SiCON, a combination thereof, or the like, and may be formed using atomic layer deposition (ALD), chemical vapor deposition (CVD), a combination thereof, or the like. In some embodiments, the liner layer 201 has a thickness between about 5 nm and about 100 nm. In some embodiments, the liner layer 201 is patterned to expose a top surface of the substrate 103. In some embodiments, the patterning processes may comprise suitable photolithography and etching methods. In the embodiment illustrated in FIG. 2, after completing the patterning process, the liner layer 201 fully covers the doped region 107. In other embodiments, the liner layer 201 may partially cover the doped region 107.

In some embodiments, after forming the liner layer 201, conductive layers 203A-203D and dielectric layer 205A-205D are partially formed in the recess 105 (see FIG. 1) in an alternating manner. The conductive layers 203A-203D may be also referred to as capacitor electrodes 203A-203D. In some embodiments, each of the conductive layers 203A-203D may comprise a conductive material such as doped silicon, polysilicon, copper, tungsten, an aluminum or copper alloy, titanium, titanium nitride, tantalum, tantalum nitride, a combination thereof, or the like, and may be formed using plating, physical vapor deposition (PVD), ALD, CVD, a combination thereof, or the like. In some embodiments, each of the conductive layers 203A-203D has a thickness between about 10 nm and about 100 nm. In some embodiments, each of the dielectric layer 205A-205D may comprise a high-K dielectric material such as aluminum oxide, zirconium oxide, a combination thereof, a multilayer thereof, or the like. In an embodiment, each of the dielectric layers 205A-205D comprises a multilayer including two layers of zirconium oxide and a layer of aluminum oxide interposed between the layers of zirconium oxide. In some embodiments, each of the dielectric layers 205A-205D has a thickness between about 0.3 nm and about 10 nm.

In some embodiments, after forming the conductive layer 203A over the liner layer 201, the conductive layer 203A is patterned to expose portions of a top surface of the liner layer 201. In some embodiments, the patterning processes may comprise suitable photolithography and etching methods. Subsequently, spacers 207A are formed along opposite sidewalls of the conductive layer 203A. Each of the spacers 207A may comprise a dielectric material such as silicon oxide, silicon nitride, silicon oxynitride, a combination thereof, a multilayer thereof, or the like. In some embodiments, the spacers 207A are formed by blanket depositing a dielectric material using ALD, CVD, a combination thereof, or the like, and anisotropically etching the dielectric material to remove horizontal portions of the dielectric material. Remaining vertical portions of the dielectric material form the spacers 207A. In some embodiments, each of the spacers 207A has a width between about 5 nm and about 50 nm. Subsequently, the dielectric layer 205A is formed over the conductive layer 203A and the spacers 207A. In some embodiments, the dielectric layer 205A is patterned to remove portions of the dielectric layer 205 extending beyond the spacers 207A. In some embodiments, the patterning processes may comprise suitable photolithography and etching methods.

Next, the conductive layer 203B is blanket formed over the dielectric layer 205A and the substrate 103. The conductive layer 203B is then patterned to expose portions of a top surface of dielectric layer 205A. In some embodiments, the patterning processes may comprise suitable photolithography and etching methods. Subsequently, spacers 207B are formed along opposite sidewalls of the conductive layer 203B. In some embodiments, the spacers 207B may be formed using similar materials and methods as the spacers 207A and the description is not repeated herein. In some embodiments, each of the spacers 207B has a width between about 5 nm and about 50 nm. Subsequently, the dielectric layer 205B is formed over the conductive layer 203B and the spacers 207B. In some embodiments, the dielectric layer 205B is patterned to remove portions of the dielectric layer 205B extending beyond the spacers 207B. In some embodiments, the patterning processes may comprise suitable photolithography and etching methods.

Next, the process steps described above with reference to forming the conductive layer 203B, the spacers 207B and the dielectric layer 205B are repeated to form the conductive layer 203C, the spacers 207C and the dielectric layer 205C over the dielectric layer 205B and to form the conductive layer 203D, the spacers 207D and the dielectric layer 205D. In some embodiments, the spacers 207C and 207D may be formed using similar materials and methods as the spacers 207A and the description is not repeated herein. In some embodiments, each of the spacers 207C has a width between about 5 nm and about 50 nm. In some embodiments, each of the spacers 207D has a width between about 5 nm and about 50 nm. In the embodiment illustrated in FIG. 2, the DTC 213 comprises four capacitor electrodes. In other embodiments, the DTC 213 may comprise more or less than four capacitor electrodes based on design requirements for the DTC 213. As one of ordinary skill in the art will recognize, the above described process for forming DTCs is merely one method of forming the DTCs, and other methods are also fully intended to be included within the scope of the embodiments.

Referring further to FIG. 2, after partially forming the DTC 213 in the substrate 103, remaining portion of the recess 105 (see FIG. 1) is filled with a dielectric material 209. In some embodiments, the dielectric material 209 may comprise an oxide such as silicon oxide, a nitride such as a silicon nitride, a combination thereof, a multilayer thereof, or the like. In some embodiments, the dielectric material 209 is patterned to remove portions of the dielectric material 209 extending beyond the spacers 207D. In some embodiments, the patterning processes may comprise suitable photolithography and etching methods.

In some embodiments, after forming and patterning the dielectric material 209, an etch stop layer (ESL) 211 is formed over the DTC 213. In some embodiments, the ESL 211 may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, plasma-enhanced CVD (PECVD), ALD, a combination thereof, or the like. In some embodiments, the ESL 211 has a thickness between about 3 nm and about 30 nm. In some embodiments, the ESL 211 is used to aid in forming conductive vias that provide electrical connection to the conductive layers 203A-203D of the DTC 213. The ESL 211 may be also referred to as a contact etch stop layer (CESL).

Figure 3:
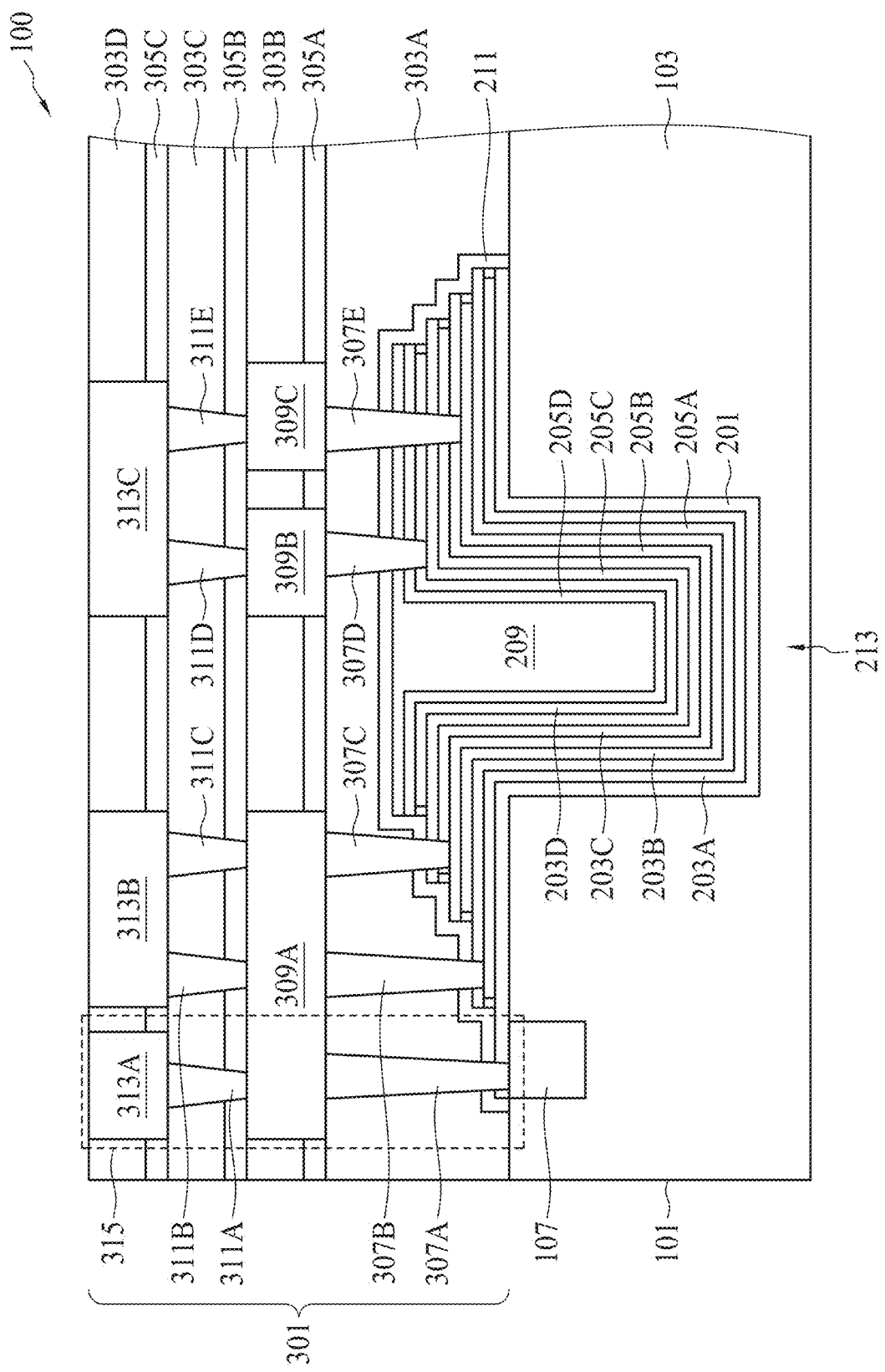

Referring to FIG. 3, after forming the DTC 213, an interconnect structure 301 is formed over the substrate 103 and the DTC 213. In some embodiments, the interconnect structure 301 comprises a plurality of dielectric layers with conductive features embedded in the plurality of dielectric layers. In the embodiment illustrated in FIG. 3, the interconnect structure 301 comprises a dielectric layer 303A with conductive vias 307A-307E embedded within the dielectric layer 303A, a dielectric layer 303B with conductive lines 309A-309C embedded within the dielectric layer 303B, a dielectric layer 303C with conductive vias 311A-311E embedded within the dielectric layer 303C, and a dielectric layer 303D embedded with conductive lines 313A-313C within the dielectric layer 303D. In the embodiment illustrated in FIG. 3, the interconnect structure 301 comprises four dielectric layers with embedded conductive features. In other embodiments, the interconnect structure 301 may comprise more or less than four dielectric layers with embedded conductive features based on design requirements of the interconnect structure 301.

In some embodiments, the dielectric layers 303A-303D may include a low-k dielectric material such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, CVD, PECVD, ALD, a combination thereof, or the like. The conductive features (such as conductive vias 307A-307E and 311A-311E and conductive lines 309A-309C and 313A-313C) may be formed using any suitable method, such as a damascene method, or the like. In some embodiments, the steps for forming the conductive features include forming openings in the respective dielectric layers, depositing one or more barrier/adhesion layers (not shown) in the openings, depositing seed layers (not shown) over the one or more barrier/adhesion layers, and filling the openings with a conductive material. A chemical mechanical polishing (CMP) is then performed to remove excess materials of the one or more barrier/adhesion layers, the seed layers, and the conductive material overfilling the openings.

In some embodiments, the one or more barrier/adhesion layers may comprise titanium, titanium nitride, tantalum, tantalum nitride, a combination thereof, or the like, and may be formed using PVD, CVD, ALD, a combination thereof, or the like. The seed layers may comprise copper, titanium, nickel, gold, manganese, a combination thereof, or the like, and may be formed by plating, ALD, CVD, PVD, sputtering, a combination thereof, or the like. The conductive material may comprise copper, aluminum, tungsten, combinations thereof, alloys thereof, or the like, and may be formed using, for example, by plating, or other suitable methods.

In some embodiments, the interconnect structure 301 further comprises etch stop layers (ESLs) 305A-305C formed between adjacent ones of the dielectric layers 303A-303D. A material for the ESLs 305A-305C is chosen such that etch rates of the ESLs 305A-305C are less than etch rates of corresponding ones of the dielectric layers 303A-303D. In some embodiments, an etch rate of the ESL 305A is less than an etch rate of the dielectric layer 303B. In some embodiments, an etch rate of the ESL 305B is less than an etch rate of the dielectric layer 303C. In some embodiments, an etch rate of the ESL 305C is less than an etch rate of the dielectric layer 303D. In some embodiments, each of the ESLs 305A-305C may comprise similar material as the ESL 211 described above with reference to FIG. 2 and the description is not repeated herein.

In some embodiments, the conductive via 307A extends through the dielectric layer 303A, the ESL 211, and the liner layer 201 and physically contacts the doped region 107. The conductive via 307A electrically couples the doped region 107 to the conductive line 309A. The conductive via 307B extends through the dielectric layer 303A, the ESL 211, and the dielectric layer 205A and physically contacts the conductive layer 203A. The conductive via 307B electrically couples the conductive layer 203A to the conductive line 309A. The conductive via 307C extends through the dielectric layer 303A, the ESL 211, and the dielectric layer 205C and physically contacts the conductive layer 203C. The conductive via 307C electrically couples the conductive layer 203C to the conductive line 309A. The conductive via 307D extends through the dielectric layer 303A, the ESL 211, the dielectric material 209, and the dielectric layer 205D and physically contacts the conductive layer 203D. The conductive via 307D electrically couples the conductive layer 203D to the conductive line 309B. The conductive via 307E extends through the dielectric layer 303A, the ESL 211, the dielectric material 209, the dielectric layers 205B-205D, the conductive layers 203C and 203D and physically contacts the conductive layer 203B. The conductive via 307E electrically couples the conductive layer 203B to the conductive line 309C. In the embodiment illustrated in FIG. 3, the conductive vias 307A-307E partially extend into respective ones of the conductive layers 203A-203D. In other embodiments, one or more of the conductive vias 307A-307E may fully extend though respective ones of conductive layers 203A-203D.

In some embodiment, the conductive via 311A extends through the dielectric layer 303C and the ESL 305B and electrically couples the conductive line 313A to the conductive line 309A. The conductive vias 311B and 311C extend through the dielectric layer 303C and the ESL 305B and electrically couple the conductive line 313B to the conductive line 309A. The conductive via 311D extends through the dielectric layer 303C and the ESL 305B and electrically couples the conductive line 313C to the conductive line 309B. The conductive via 311E extends through the dielectric layer 303C and the ESL 305B and electrically couples the conductive line 313C to the conductive line 309C.

Referring further to FIG. 3, in some embodiments some of the conductive features of the interconnect structure 301 near the edge 101 of the semiconductor device wafer 100 form a seal ring structure 315. In the embodiment illustrated in FIG. 3, the seal ring structure 315 comprises the conductive vias 307A and 311A, the conductive line 313A and a portion of the conductive line 309A. In such embodiments, the conductive line 309A electrically couples the seal ring structure 315 to the rest of the interconnect structure 301. In some embodiments, by forming the conductive line 309A as a single continuous structure shared between the seal ring structure 315 and the rest of the interconnect structure 301, the number of masks and the number of masking processes used for forming the conductive lines are reduced. In some embodiment, the seal ring structure 315 extends along the edge 101 of the semiconductor device wafer 100 and encircles an interior portion of the semiconductor device wafer 100 in a plan view.

Figure 4:
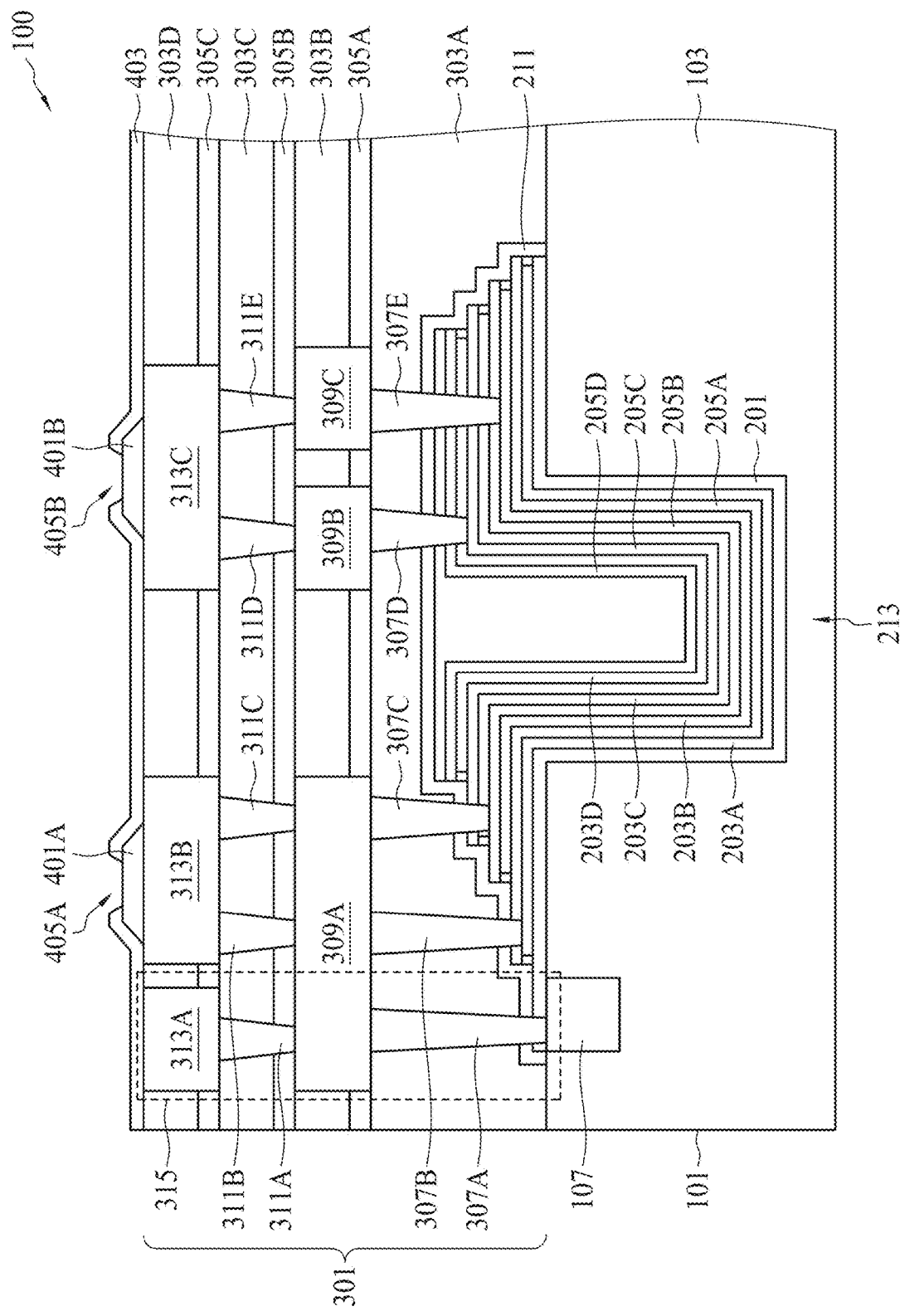

Referring to FIG. 4, contact pads 401A and 401B are formed over the interconnect structure 301. The contact pad 401A is in electrical contact with the conductive line 313B. The contact pad 401B is in electrical contact with the conductive line 313C. In some embodiments, the contact pads 401A and 401B may comprise a conductive material such as aluminum, copper, tungsten, silver, gold, a combination thereof, or the like. In some embodiments, a conductive material may be formed over the interconnect structure 301 using, for example, PVD, ALD, electro-chemical plating, electroless plating, a combination thereof, or the like. Subsequently, the conductive material is patterned to form the contact pads 401A and 401B. In some embodiments, the conductive material may be patterned using suitable photolithography and etching methods.

In some embodiments, a passivation layer 403 is formed over the interconnect structure 301 and the contact pads 401A and 401B. In some embodiments, the passivation layer 403 may comprise one or more layers of non-photo-patternable insulating materials, one or more layers of photo-patternable insulating materials, a combination thereof, or the like. The non-photo-patternable insulating materials may comprise silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. The photo-patternable insulating materials may comprise polybenzoxazole (PBO), polyimide (PI), benzocyclobutene (BCB), a combination thereof, or the like, and may be formed using a spin-on coating process, or the like. In some embodiments, the passivation layer 403 has a thickness between about 5 nm and about 50 nm.

In some embodiments, the openings 405A and 405B are formed in the passivation layer 403 to expose portions of the contact pads 401A and 401B, respectively. In some embodiments, the passivation layer 403 may be patterned using suitable photolithography and etching method. In some embodiments, the openings 405A and 405B have a width between about 500 nm and about 5000 nm.

Figure 5:
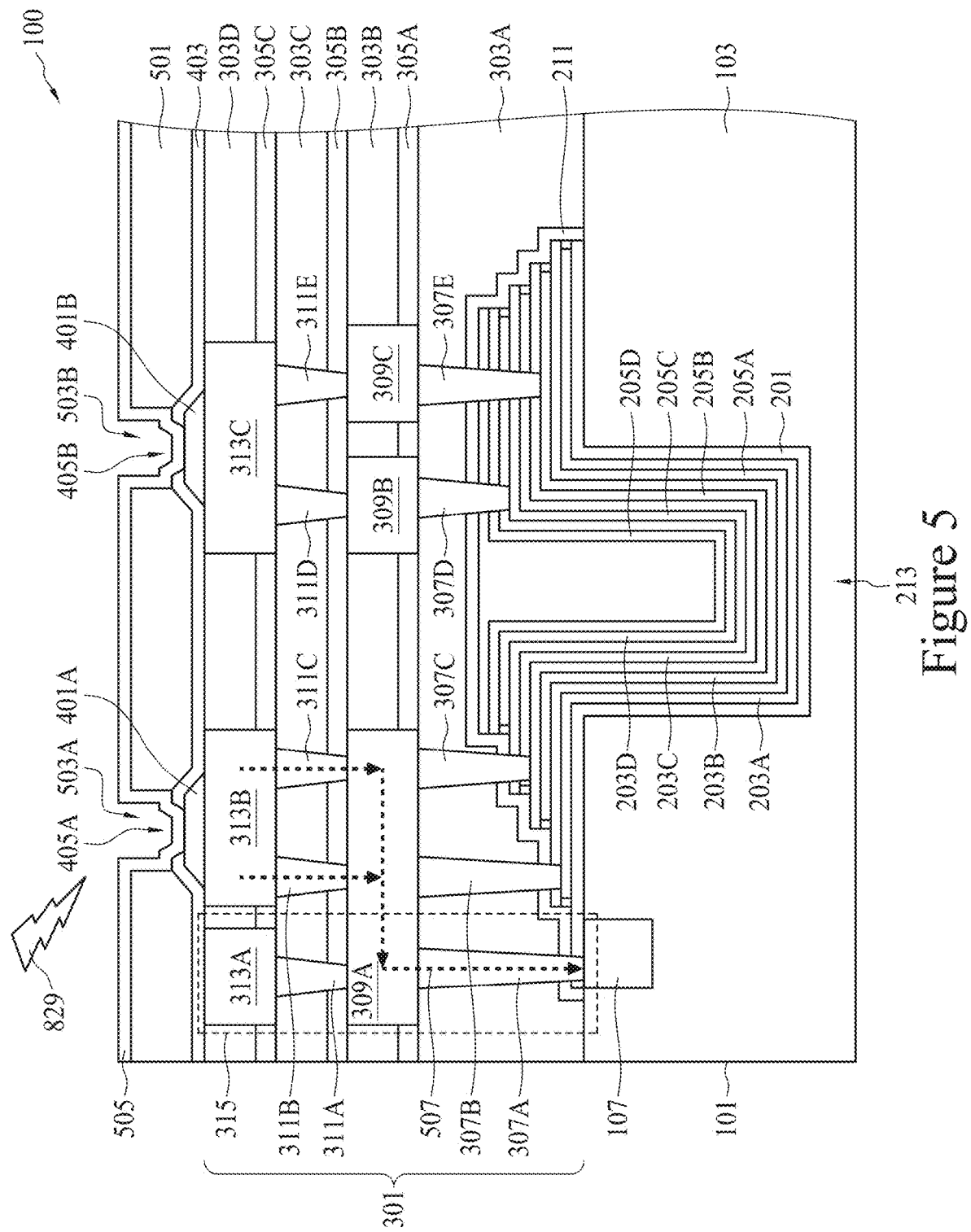
Figure 6:
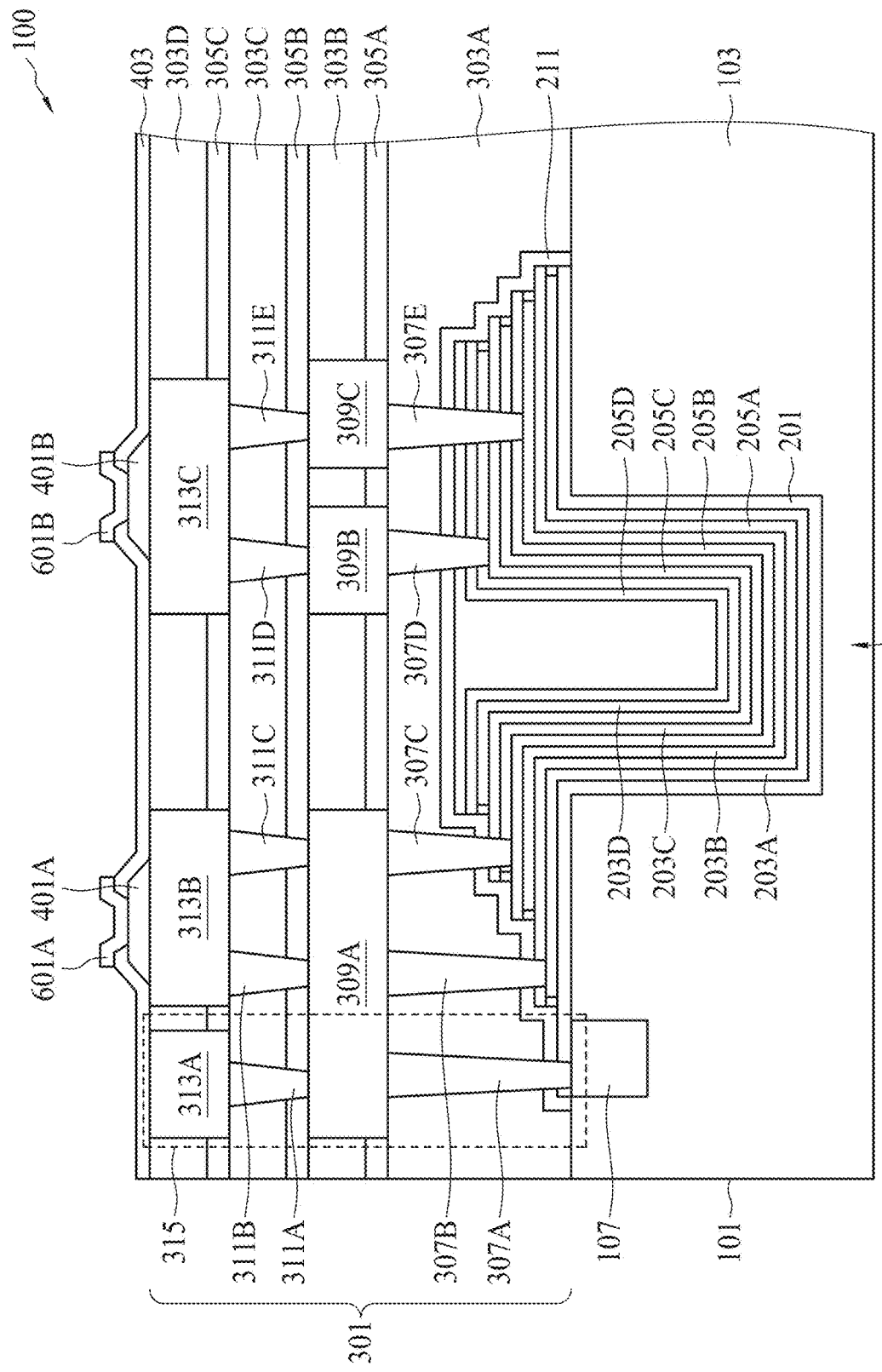

FIGS. 5 and 6 illustrate the formation of underbump metallizations (UBMs) 601A and 601B over the contact pads 401A and 401B, respectively. In some embodiments, each of the UBMs 601A and 601B may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 601A and 601B. Any suitable materials or layers of material that may be used for the UBMs 601A and 601B are fully intended to be included within the scope of the current application.

Referring to FIG. 5, a mask layer 501 is formed over the passivation layer 403. In some embodiments, the mask layer 501 comprises a photoresist, or the like. In some embodiments, the mask layer 501 is patterned to form openings 503A and 503B in the mask layer 501. In some embodiments where the mask layer 501 comprises a photoresist, the patterning process may include suitable photolithography methods. The opening 503A exposes the opening 405A in the passivation layer 403. The opening 503B exposed the opening 405B in the passivation layer 403. In some embodiments, the openings 503A and 503B have a width between about 1000 nm and about 5000 nm.

In some embodiments, after forming the openings 503A and 503B in mask layer 501, a conductive layer 505 is formed over the mask layer 501 and sidewalls and bottoms of combined openings comprising the openings 503A and 503B and the openings 405A and 405B. In some embodiments, the conductive layer 505 comprises titanium, copper, nickel, chrome, gold, tungsten, alloys thereof, multilayers thereof, or the like, and may be formed using PVD, ALD, CVD, electro-chemical plating, electroless plating, a combination thereof, or the like. In some embodiments, the conductive layer 505 has a thickness between about 5 nm and about 100 nm.

Referring to FIG. 6, after forming the conductive layer 505, the mask layer 501 and portions of the conductive layer 505 formed thereon are removed. The remaining portions of the conductive layer 505 form the UBMs 601A and 601B over the contact pads 401A and 401B, respectively. In some embodiments where the mask layer 501 comprises a photoresist, the removal process may include an ashing process followed by a wet clean process.

Figure 7:
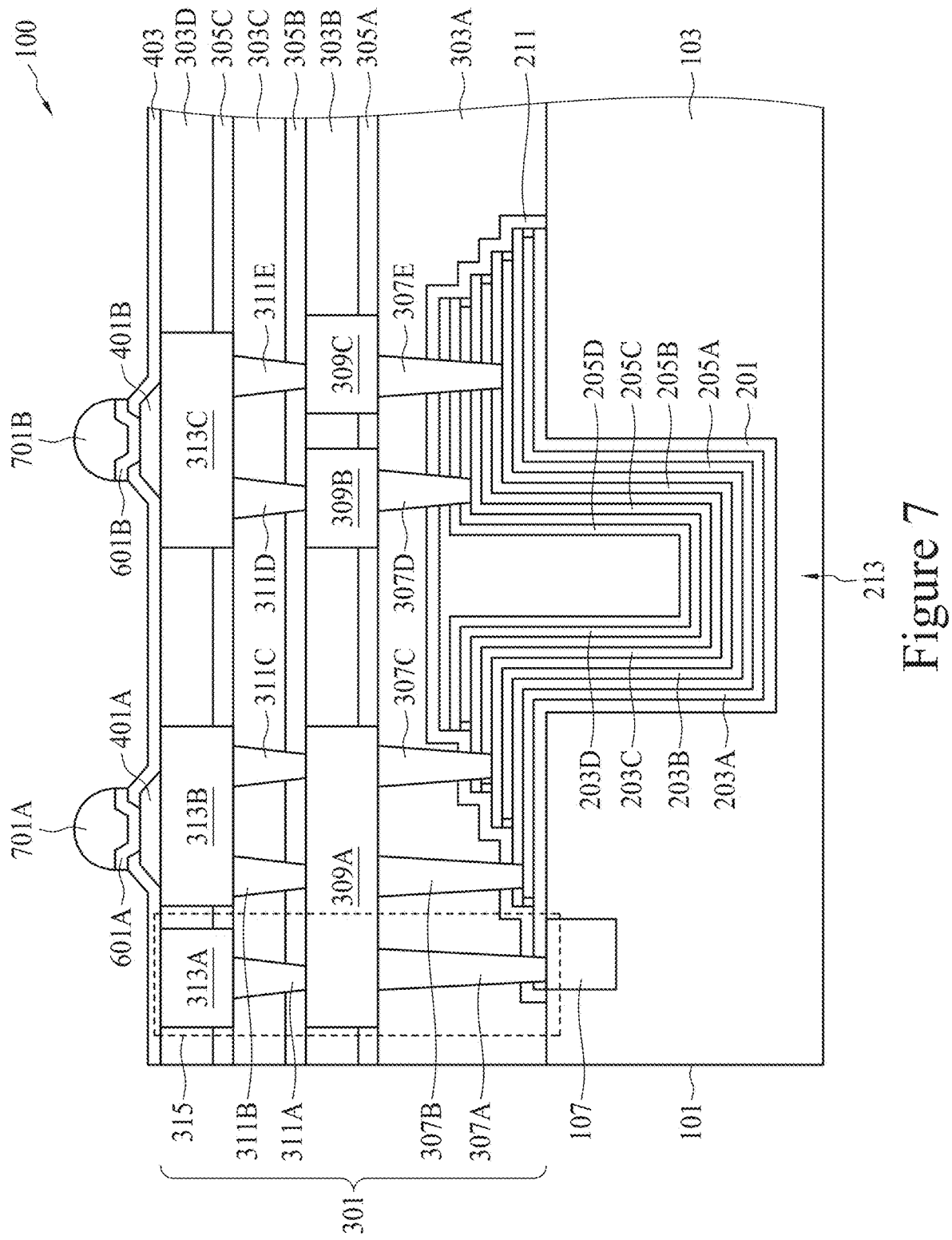

Referring to FIG. 7, connectors 701A and 701B are formed over and electrically coupled to the UBMs 601A and 601B, respectively. In some embodiments, each of the connectors 701A and 701B may be a solder ball, a controlled collapse chip connection (C4) bump, a ball grid array (BGA) ball, a micro bump, an electroless nickel-electroless palladium-immersion gold technique (ENEPIG) formed bump, a copper pillar, a combination thereof, or the like. In some embodiments where the connectors 701A and 701B are formed of solder materials, a reflow process may be performed in order to shape the solder material into the desired bump shapes. In some embodiments, after forming the connectors 701A and 701B, the semiconductor device wafer 100 is diced to form individual semiconductor devices. The dicing process may include sawing, a laser ablation method, an etching process, a combination thereof, or the like. Subsequently, each of the individual semiconductor devices may be tested to identify known good dies (KGDs) for further processing.

Figure 8:
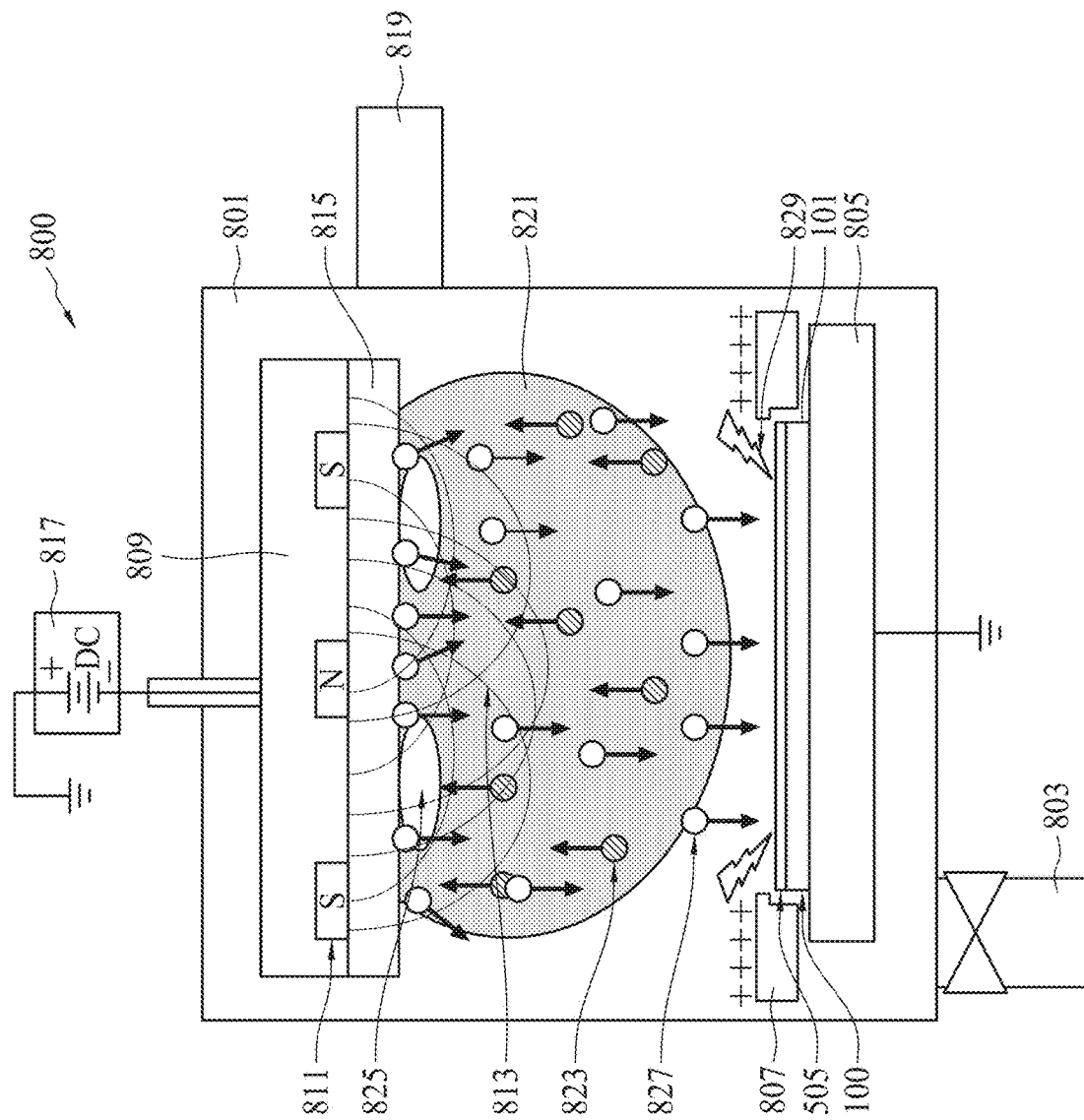
FIG. 8 illustrates a cross-section view of a deposition apparatus in accordance with some embodiments.

FIG. 8 illustrates a cross-section view of a deposition apparatus 800 in accordance with some embodiments. In some embodiments, the deposition apparatus 800 is used for depositing the conductive layer 505 over the semiconductor device wafer 100 as described above with reference to FIG. 5. In some embodiments, the deposition apparatus 800 is a PVD apparatus performing a direct-current (DC) magnetron sputtering processes. In some embodiments, the deposition apparatus 800 includes a chamber 801, which is a vacuum chamber. In some embodiments, a pump 803 is coupled to the chamber 801 to tune a pressure within the chamber 801. In some embodiments, during the deposition process a process pressure may be between about 1 mTorr and about 100 mTorr. A chuck 805 is disposed in the chamber 801. The chuck 805 is configured to hold the semiconductor device wafer 100 while depositing the conductive layer 505 over the semiconductor device wafer 100. In some embodiments, the chuck 805 may be an electrostatic chuck, a vacuum chuck, or the like. In some embodiments, the chuck 805 may be configured as an anode and may also be referred to as an anode 805. A shadow edge ring 807 is disposed in the chamber 801 over the chuck 805 and around the semiconductor device wafer 100. In some embodiments, the shadow edge ring 807 protects the chuck 805 during the deposition process.

In some embodiments, a cathode 809 is disposed above the chuck 805, such that the semiconductor device wafer 100 is interposed between the cathode 809 and the chuck 805. In some embodiments, the cathode 809 comprises a magnetic array 811. In some embodiments, the magnetic array 811 comprises one or more magnets. The magnetic array 811 generates a magnetic field within the chamber 801 indicated by magnetic lines 813 in FIG. 8. A target material layer 815 is disposed on the cathode 809, such that the target material layer 815 is interposed between the cathode 809 and the semiconductor device wafer 100. The target material layer 815 comprises a material that forms the conductive layer 505 during the deposition process.

In some embodiments, a voltage source 817 coupled to the cathode 809 and generates a desired voltage between the cathode 809 and the anode 805. In some embodiments, the voltage source 817 is a DC voltage source. In some embodiments, the voltage source 817 generates a negative voltage between the cathode 809 and the anode 805, such that the negative voltage is between about 50 V and about 350 V, such as about 300 V. In some embodiments, the voltage source 817 has a power between about 0.5 kW to about 50 kW, such as about 1 kW.

In some embodiments, a gas inlet 819 provides suitable process gasses to the chamber 801. In some embodiments, the suitable process gasses include inert gases, such as He, Ne, Ar, Kr, Xe, Ra, a combination thereof, or the like. In some embodiments, electrons (not shown) accelerated by the voltage generated by the voltage source 817 collide with atoms of the process gas to ionize the atoms and generate plasma 821 within the chamber 801. The plasma 821 comprises ions 823 of the process gas. In some embodiments, the magnetic array 811 traps the plasma 821 near a lower surface of the cathode 809 to form high density plasma regions 825. The high density plasma regions 825 improve sputtering efficiency of the ions 823. During the deposition process, the positively charged ions 823 accelerate toward and collide with the target material layer 815. The collision ejects atoms 827 of the target material, which are then deposited on the semiconductor device wafer 100 to form the conductive layer 505.

Referring further to FIGS. 5 and 8, during the deposition of the conductive layer 505, charge may accumulate on the shadow edge ring 807 and may generate a potential difference between the shadow edge ring 807 and the semiconductor device wafer 100. In some embodiments, due to improper spacing between the edge 101 of the semiconductor device wafer 100 and the shadow edge ring 807, an electrical arc 829 is formed between the edge 101 of the semiconductor device wafer 100 and the shadow edge ring 807 and a large current pulse flows though the semiconductor device wafer 100.

Referring further to FIG. 5, during the arc discharge, the current pulse has a path 507 through the interconnect structure 301 of the semiconductor device wafer 100. In the embodiment illustrated in FIG. 5, the path 507 extends through the conductive layer 505, the contact pad 401A, the conductive line 313B, the conductive vias 311B and 311C, the conductive line 309A and the conductive via 307A. Following the path 507, the current pulse flows to the doped region 107 and then to the substrate 103. By forming the doped region 107, the resistivity of the substrate 103 is reduced at the interface between the conductive via 307A and the substrate 103 and no significant charge is accumulated at the interface between the conductive via 307A and the substrate 103. Accordingly, by forming the doped region 107, a low-resistivity path is formed for the current pulse to flow into the substrate 103.

By electrically coupling the seal ring structure 315 to the rest of the interconnect structure 301 using the conductive line 309A, no significant current flows though the conductive vias 307B and 307C to the DTC 213. Accordingly, no significant charge is accumulated at an interface between the conductive layer 203A of the DTC 213 and the conductive via 307B and no significant voltage drop is generated across the conductive layer 203A and the liner layer 201. Therefore, burn-out of the conductive layer 203A and the liner layer 201 due to the large voltage drop and shorting of the DTC 213 are avoided. Furthermore, no significant charge is accumulated at an interface between the conductive layer 203C of the DTC 213 and the conductive via 307C and no significant voltage drop is generated across the conductive layer 203C and the dielectric layer 205B. Therefore, burn-out of the conductive layer 203C and dielectric layer 205B due to the large voltage drop and shorting of the DTC 213 are avoided.

Figure 9:
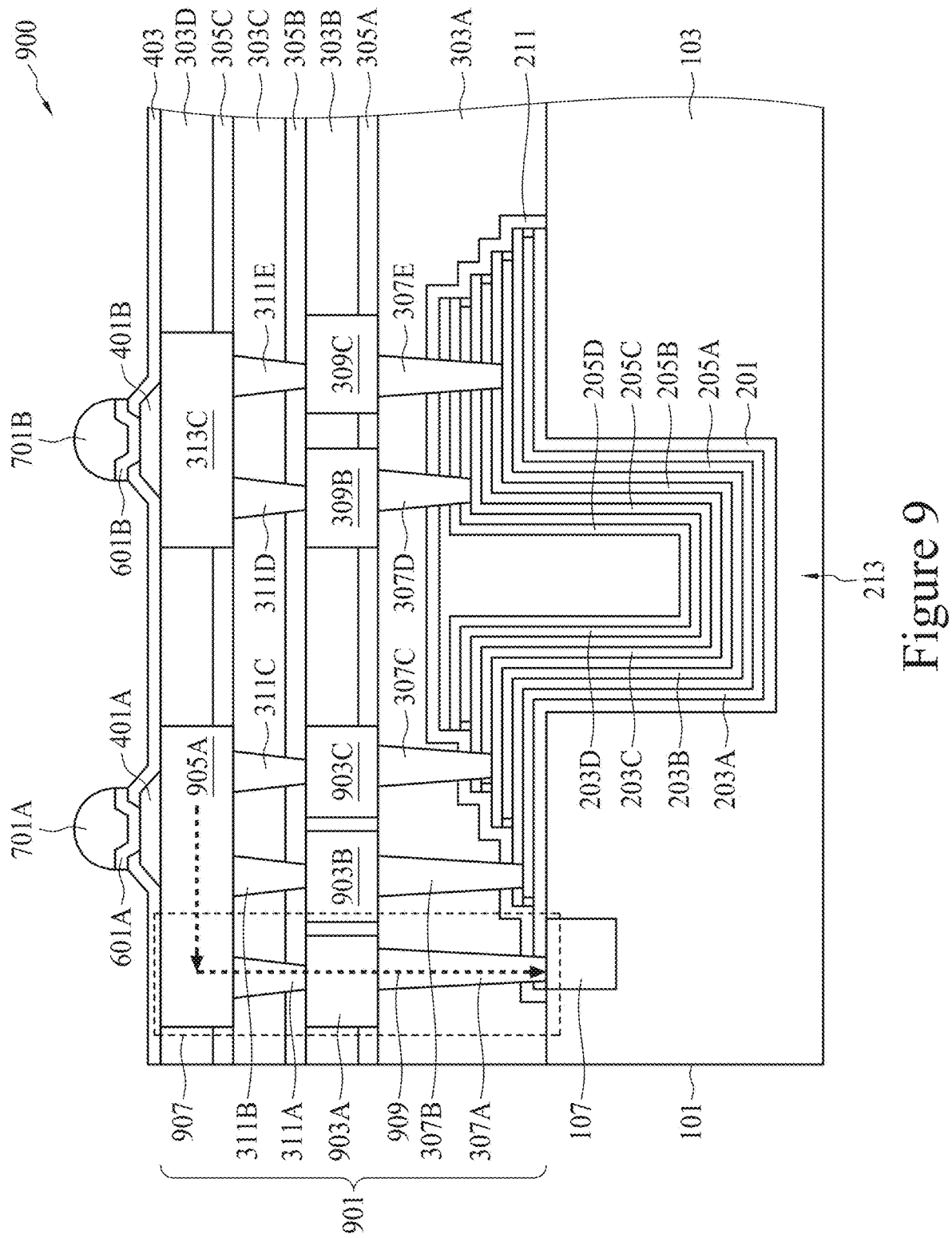
FIG. 9 illustrates a cross-sectional view of a semiconductor device wafer in accordance with some embodiments.

FIG. 9 illustrates a cross-sectional view of a semiconductor device wafer 900 in accordance with some embodiments. In some embodiment, the semiconductor device wafer 900 is similar to the semiconductor device wafer 100 illustrated in FIG. 7, with like features being labeled by like numerical reference, and the descriptions of the like features are not repeated herein. In some embodiments, the semiconductor device wafer 900 may be formed using similar process steps as described above with reference to FIGS. 1-7 and the description is not repeated herein. The interconnect structure 901 of the semiconductor device wafer 900 has a different layout compared to the interconnect structure 301 of the semiconductor device wafer 100. Instead of the single continuous conductive line 309A being interposed between the conductive vias 307A-307C and the conductive vias 311A-311C in the interconnect structure 301, the interconnect structure 901 comprises three disconnected conductive lines 903A-903C that are interposed between the conductive vias 307A-307C and the conductive vias 311A-311C, respectively. Furthermore, instead of two disconnected conductive lines 313A and 313B in the interconnect structure 301, the interconnect structure 901 comprises a single continuous conductive line 905A. Accordingly, the conductive line 905A electrically couples the seal ring structure 907 to the rest of the interconnect structure 901.

In some embodiments, during the formation of UBMs 601A and 601B as described above with reference to FIGS. 5, 6 and 8, due to the arcing discharge during the deposition of the conductive layer 505, a current pulse flows through the semiconductor device wafer 900 along a path 909. In the embodiment illustrated in FIG. 9, the path 909 extends through the conductive layer 505, the contact pad 401A, the conductive line 905A, the conductive vias 311A, the conductive line 903A and the conductive via 307A. Following the path 909, the current pulse flows to the doped region 107 and then to the substrate 103. By forming the doped region 107, the resistivity of the substrate 103 is reduced at the interface between the conductive via 307A and the substrate 103 and no significant charge is accumulated at the interface between the conductive via 307A and the substrate 103. Accordingly, by forming the doped region 107, a low-resistivity path is formed for the current pulse to flow into the substrate 103.

By electrically coupling the seal ring structure 907 to the rest of the interconnect structure 901 using the conductive line 905A, no significant current flows though the conductive vias 307B and 307C to the DTC 213. Accordingly, no significant charge is accumulated at an interface between the conductive layer 203A of the DTC 213 and the conductive via 307B and no significant voltage drop is generated across the conductive layer 203A and the liner layer 201. Therefore, burn-out of the conductive layer 203A and the liner layer 201 due to the large voltage drop and shorting of the DTC 213 are avoided. Furthermore, no significant charge is accumulated at an interface between the conductive layer 203C of the DTC 213 and the conductive via 307C and no significant voltage drop is generated across the conductive layer 203C and the dielectric layer 205B. Therefore, burn-out of the conductive layer 203C and dielectric layer 205B due to the large voltage drop and shorting of the DTC 213 are avoided.

Figure 10:
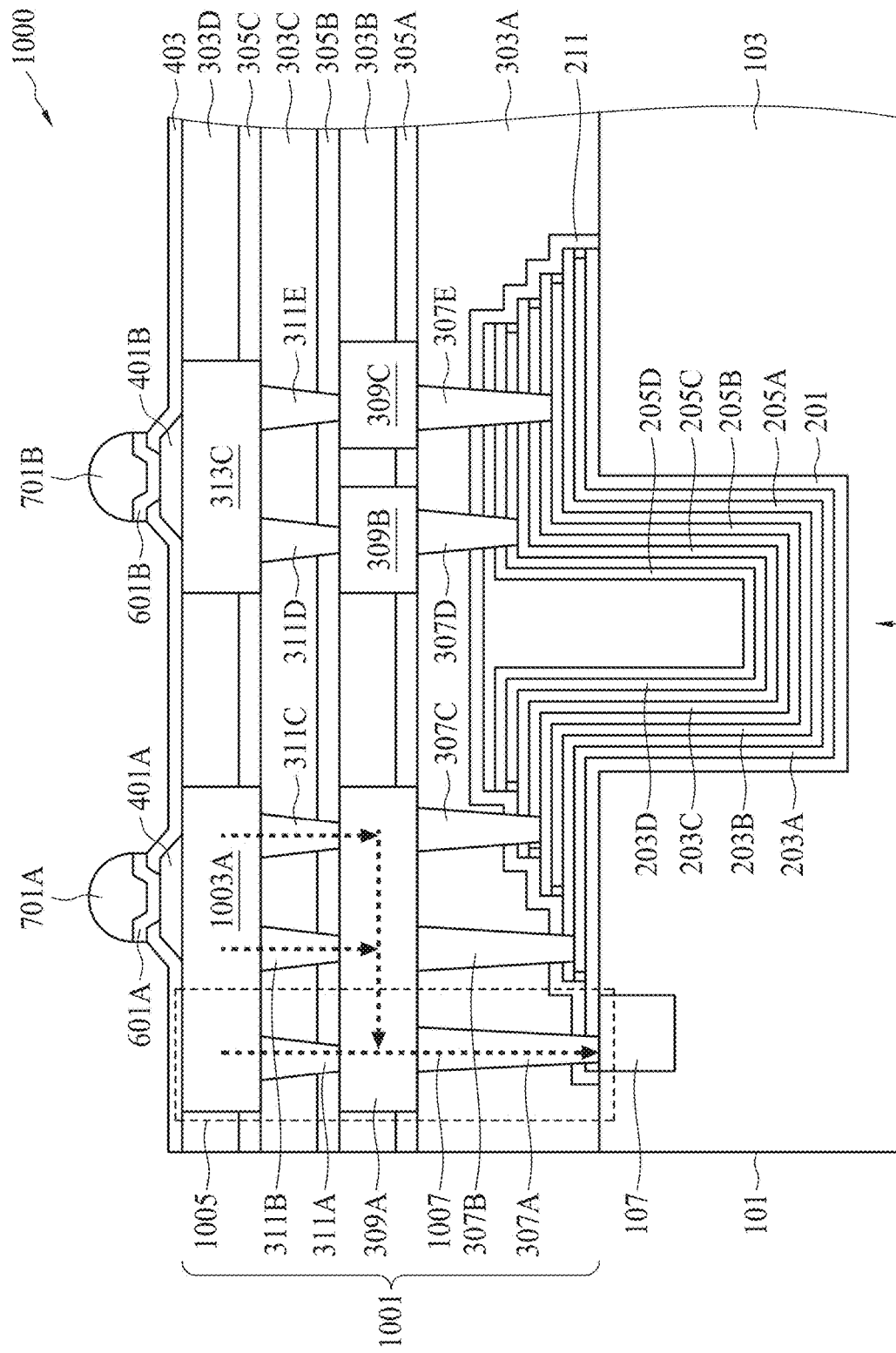
FIG. 10 illustrates a cross-sectional view of a semiconductor device wafer in accordance with some embodiments.

FIG. 10 illustrates a cross-sectional view of a semiconductor device wafer 1000 in accordance with some embodiments. In some embodiment, the semiconductor device wafer 1000 is similar to the semiconductor device wafer 100 illustrated in FIG. 7, with like features being labeled by like numerical reference, and the descriptions of the like features are not repeated herein. In some embodiments, the semiconductor device wafer 1000 may be formed using similar process steps as described above with reference to FIGS. 1-7 and the description is not repeated herein. The interconnect structure 1001 of the semiconductor device 1000 has a different layout compared to the interconnect structure 301 of the semiconductor device wafer 100. Instead of two disconnected conductive lines 313A and 313B in the interconnect structure 301, the interconnect structure 1001 comprises a single continuous conductive line 1003A. Accordingly, the conductive lines 1003A and 309A electrically couple the seal ring structure 1005 to the rest of the interconnect structure 1001.

In some embodiments, during the formation of UBMs 601A and 601B as described above with reference to FIGS. 5, 6 and 8, due to the arcing discharge during the deposition of the conductive layer 505, a current pulse flows through the semiconductor device wafer 1000 along a path 1007. In the embodiments illustrated in FIG. 10, the path 1007 extends through the conductive layer 505, the contact pad 401A, the conductive line 1003A, the conductive vias 311A-311C, the conductive line 309A and the conductive via 307A. Following the path 1007, the current pulse flows to the doped region 107 and then to the substrate 103. By forming the doped region 107, the resistivity of the substrate 103 is reduced at the interface between the conductive via 307A and the substrate 103 and no significant charge is accumulated at the interface between the conductive via 307A and the substrate 103. Accordingly, by forming the doped region 107, a low-resistivity path is formed for the current pulse to flow into the substrate 103.

By electrically coupling the seal ring structure 1005 to the rest of the interconnect structure 1001 using the conductive lines 1003A and 309A, no significant current flows though the conductive vias 307B and 307C to the DTC 213. Accordingly, no significant charge is accumulated at an interface between the conductive layer 203A of the DTC 213 and the conductive via 307B and no significant voltage drop is generated across the conductive layer 203A and liner layer 201. Therefore, burn-out of the conductive layer 203A and the liner layer 201 due to the large voltage drop and shorting of the DTC 213 are avoided. Furthermore, no significant charge is accumulated at an interface between the conductive layer 203C of the DTC 213 and the conductive via 307C and no significant voltage drop is generated across the conductive layer 203C and the dielectric layer 205B. Therefore, burn-out of the conductive layer 203C and dielectric layer 205B due to the large voltage drop and shorting of the DTC 213 are avoided.

Referring further to FIGS. 7, 9 and 10, the illustrated embodiments have been described in the context of layouts of the interconnect structures that are used to protect the DTCs from the arcing discharge during formation of UBMs. As one of ordinary skill in the art will recognize, the above-described layouts of the interconnect structures 301, 901 and 1001 may be used to protect other types of device from the arcing discharge during formation of UBMs. In some embodiments, instead of the DTCs, devices such as planar CMOS devices, FinFET devices, or the like may be formed in or on the substrate. In such embodiments, the layouts of the interconnect structures 301, 901 and 1001 may protect source/drain regions and/or a gate stack of a transistor device (such as a FinFET device or a planar transistor device) from the arcing discharge.

Figure 11:
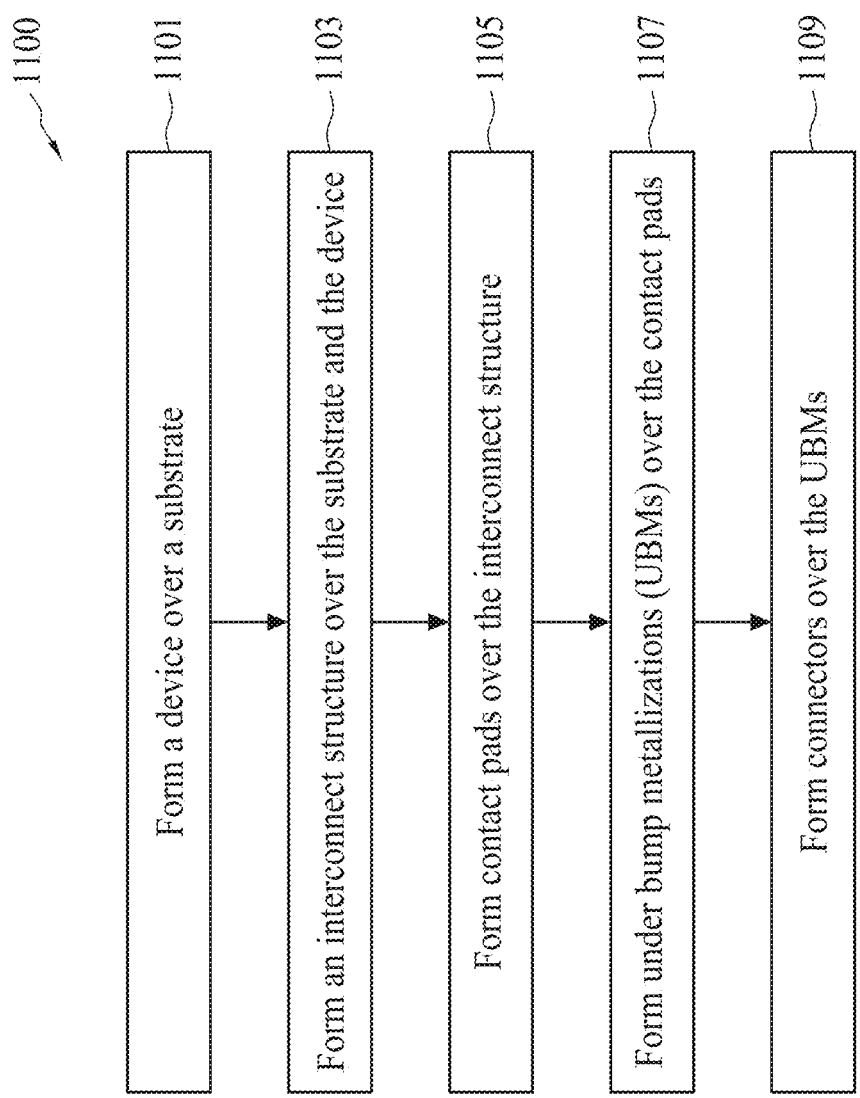
FIG. 11 is a flow diagram illustrating a method of forming a semiconductor device in accordance with some embodiments.

FIG. 11 is a flow diagram illustrating a method 1100 of forming a semiconductor device in accordance with some embodiments. The method 1100 starts with step 1101, where a device (such as the DTC 213 illustrated in FIG. 2) is formed over the substrate (such as the substrate 103 illustrated in FIG. 2) as described above with reference to FIGS. 1 and 2. In step 1103, an interconnect structure (such as the interconnect structure 301 illustrated in FIG. 3) is formed over the substrate and the device as described above with reference to FIG. 3. In step 1105, contact pads (such as the contact pads 401A and 401B illustrated in FIG. 4) are formed over the interconnect structure as described above with reference to FIG. 4. In step 1107, under bump metallizations (such as the UBMs 601A and 601B illustrated in FIG. 6) are formed over the contact pads as described above with reference to FIGS. 5 and 6. In step 1109, connectors (such as the connectors 701A and 701B illustrated in FIG. 7) are formed over the under bump metallizations as described above with reference to FIG. 7.

In an embodiment, a semiconductor device includes: a substrate; a deep trench capacitor (DTC) having a portion within the substrate; and an interconnect structure over the DTC and the substrate, the interconnect structure including: a seal ring structure in electrical contact with the substrate; a first conductive via in electrical contact with the DTC; and a first conductive line electrically coupling the seal ring structure to the first conductive via. In an embodiment, the semiconductor device further includes a doped region in the substrate, the doped region being in electrical contact with the seal ring structure. In an embodiment, the seal ring structure includes: a second conductive via, the second conductive via being in physical contact with the doped region and the first conductive line; and a second conductive line over the second conductive via, the second conductive line being above the first conductive line. In an embodiment, the seal ring structure includes: a second conductive via in physical contact with the doped region; and a second conductive line over the second conductive via, the second conductive line being below the first conductive line. In an embodiment, the interconnect structure further includes a second conductive line over the first conductive line, the second conductive line electrically coupling the seal ring structure to the first conductive via. In an embodiment, the interconnect structure further includes a second conductive via in electrical contact with the DTC. In an embodiment, the first conductive line electrically coupling the seal ring structure to the second conductive via.

In another embodiment, a semiconductor device includes: a substrate; a deep trench capacitor (DTC) within the substrate; and an interconnect structure over the DTC and the substrate, the interconnect structure including: a seal ring structure in electrical contact with the substrate; a first conductive line in electrical contact with the DTC; and a second conductive line electrically coupling the seal ring structure to the first conductive line. In an embodiment, the second conductive line is interposed between the first conductive line and the DTC. In an embodiment, the first conductive line is interposed between the second conductive line and the DTC. In an embodiment, the interconnect structure further includes a first conductive via electrically coupling the first conductive line to the second conductive line. In an embodiment, the semiconductor device further includes a doped region in the substrate, the doped region being in physical contact with the seal ring structure. In an embodiment, the seal ring structure includes: a first conductive via, the first conductive via being in physical contact with the doped region; and a second conductive via over the first conductive via, the second conductive via being in physical contact with the first conductive line. In an embodiment, the seal ring structure includes: a first conductive via, the first conductive via being in physical contact with the doped region; and a second conductive via over the first conductive via, the second conductive via being in physical contact with the second conductive line.

In yet another embodiment, a method includes: forming a recess in a substrate; forming a doped region in the substrate adjacent the recess; partially forming a deep trench capacitor (DTC) in the recess; and forming an interconnect structure over the DTC and the substrate, wherein forming the interconnect structure includes: forming a seal ring structure in electrical contact with the doped region; forming a first conductive via in electrical contact with the DTC; and forming a first conductive line over the first conductive via, the first conductive line electrically coupling the seal ring structure to the first conductive via. In an embodiment, forming the interconnect structure further includes forming a second conductive line over the first conductive line. In an embodiment, forming the interconnect structure further includes forming a second conductive line between the first conductive via and the first conductive line. In an embodiment, forming the interconnect structure further includes forming a second conductive via in electrical contact with the DTC. In an embodiment, forming the DTC in the recess includes forming a plurality of conductive layers and a plurality of dielectric layers in the recess in alternating manner. In an embodiment, forming the doped region in the substrate includes performing an implantation process on the substrate.

In yet another embodiment, a semiconductor device including: a substrate; a deep trench capacitor (DTC) within the substrate; and an interconnect structure over the DTC and the substrate, the interconnect structure including: a seal ring structure in electrical contact with the substrate; a first conductive line in electrical contact with the DTC; and a second conductive line over the first conductive line, where the first conductive line electrically couples the second conductive line to the DTC, and where a portion of the first conductive line or a portion of the second conductive line are parts of the seal ring structure. In an embodiment, the interconnect structure further includes a first conductive via in electrical contact with the DTC, the first conductive via electrically coupling the first conductive line to the DTC. In an embodiment, the interconnect structure further includes a second conductive via interposed between the first conductive line and the second conductive line, the second conductive via electrically coupling the first conductive line to the second conductive line. In an embodiment, the seal ring structure includes a second conductive via electrically coupled to the substrate. In an embodiment, the semiconductor device further includes a doped region in the substrate, where the doped region is in physical contact with the second conductive via. In an embodiment, a width of the first conductive line is different from a width of the second conductive line. In an embodiment, the semiconductor device further includes a contact pad over the interconnect structure, the contact pad being electrically coupled to the substrate through the seal ring structure, where the contact pad is in physical contact with the second conductive line.

In yet another embodiment, a semiconductor device including: a substrate; a deep trench capacitor (DTC) within the substrate; an interconnect structure over the DTC and the substrate, the interconnect structure including: a seal ring structure in electrical contact with the substrate; a first conductive via in physical contact with the DTC, the first conductive via being in electrical contact with the seal ring structure; and a first conductive line over the first conductive via, the first conductive via electrically coupling the first conductive line to the DTC, the seal ring structure electrically coupling the first conductive line to the substrate; and a contact pad over the interconnect structure, the contact pad being electrically coupled to the substrate through the seal ring structure, where the contact pad is in physical contact with the first conductive line. In an embodiment, the interconnect structure further includes a second conductive line interposed between the first conductive via and the first conductive line, the second conductive line being in physical contact with the first conductive via. In an embodiment, the interconnect structure further includes a second conductive via interposed between and in physical contact with the first conductive line and the second conductive line. In an embodiment, the interconnect structure further includes a third conducive line adjacent the second conductive line, the third conducive line being electrically coupled to the DTC. In an embodiment, the interconnect structure further includes: a third conductive via in physical contact with the DTC and the second conductive line; and a fourth conductive via adjacent the second conductive via, the fourth conductive via being interposed between and in physical contact with the first conductive line and the second conductive line. In an embodiment, the semiconductor device further includes a doped region in the substrate, the doped region being in physical contact with the seal ring structure. In an embodiment, the seal ring structure includes: a second conductive via, the second conductive via being in physical contact with the doped region; and a third conductive via over the second conductive via, the third conductive via being in physical contact with the first conductive line.

In yet another embodiment, a semiconductor device including: a substrate; a doped region in the substrate; a deep trench capacitor (DTC) in the substrate adjacent the doped region; an interconnect structure over the DTC and the substrate, the interconnect structure including: a first conductive via in physical contact with the doped region; a first conductive line over the first conductive via, the first conductive line being in electrical contact with the DTC; a second conductive line over the first conductive line, the second conductive line being in electrical contact with the first conductive via and the first conductive line; and a contact pad over the interconnect structure, the contact pad being electrically coupled to the doped region through the second conductive line and the first conductive via, where the second conductive line is in physical contact with the contact pad. In an embodiment, a top surface of the doped region is level with a top surface of the substrate. In an embodiment, the interconnect structure further includes a second conductive via adjacent the first conductive via, the second conductive via being in physical contact with the first conductive line and the DTC. In an embodiment, the interconnect structure further includes a third conductive via interposed between and in physical contact with the first conductive line and the second conductive line. In an embodiment, a topmost surface of the DTC is above a bottom surface of the first conductive via and a bottom surface of the second conductive via. In an embodiment, a bottom surface of the first conductive via is below a bottom surface of the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  forming a recess in a substrate;
  forming a doped region in the substrate, the recess being adjacent to the doped region;
  at least partially forming a deep trench capacitor (DTC) in the recess; and forming an interconnect structure over the DTC and the substrate, wherein forming the interconnect structure comprises:
  forming a seal ring structure in electrical contact with the doped region, wherein the recess is laterally offset from the seal ring structure;
  forming a first conductive line in electrical contact with the DTC; and
  forming a second conductive line over the first conductive line, wherein
  the first conductive line electrically couples the second conductive line to the DTC, wherein
  a portion of one of the first conductive line or the second conductive line is a part of the seal ring structure, wherein
  the one of the first conductive line or the second conductive line is a part of a circuitry on the substrate.

2. The method of claim 1, wherein forming the interconnect structure further comprises:
  forming a dielectric layer; and
  forming a third conductive line directly over the dielectric layer, wherein the third conductive line is a part of the seal ring structure, wherein the third conductive line and the second conductive line are directly over a same dielectric layer of the interconnect structure; and
  further comprising:
  forming a passivation layer over the third conductive line and the second conductive line; and
  forming an external connection on the second conductive line, wherein the passivation layer completely covers the third conductive line after forming the external connection.

3. The method of claim 1, further comprising:
  forming a liner layer on an upper surface of the substrate and along surfaces of the recess, the liner layer extending over the doped region, wherein the DTC is formed over the liner layer; and
  forming a first dielectric layer over the DTC; and
  wherein forming the seal ring structure comprises forming a conductive via through the first dielectric layer and the liner layer to the doped region.

4. The method of claim 3, further comprising, prior to forming the first dielectric layer, forming an etch stop layer over the DTC, wherein the first dielectric layer is formed over the etch stop layer.

5. The method of claim 1, wherein a width of the first conductive line is different from a width of the second conductive line.

6. The method of claim 1, wherein the first conductive line is a part of the seal ring structure.

7. The method of claim 1, wherein the second conductive line is a part of the seal ring structure.

8. A method comprising:
  forming a recess in a substrate;
  forming a doped region in the substrate;
  at least partially forming a deep trench capacitor (DTC) in the recess, wherein forming the DTC comprises forming a dielectric liner layer, the dielectric liner layer extending over the doped region; and
  forming an interconnect structure over the DTC and the substrate, wherein forming the interconnect structure comprises:
  forming a first dielectric layer over the substrate;
  forming a first conductive line in the first dielectric layer, wherein the first conductive line is electrically coupled to the DTC and the doped region, wherein a first portion of the first conductive line is a part of a seal ring structure, wherein a second portion of the first conductive line is a part of a circuitry electrically coupled to the DTC;
  forming a contact pad over the first conductive line, wherein the contact pad is electrically coupled to the first conductive line; and
  forming an underbump metallization (UBM) over the contact pad, wherein forming the UBM comprises generating an electrical current through the first conductive line to the doped region away from conductive elements of the DTC.

9. The method of claim 8, wherein the electrical current is generated during deposition of a conductive material of the UBM.

10. The method of claim 8, wherein forming the UBM comprises a plasma process.

11. The method of claim 8, further comprising forming a first conductive via, wherein the first conductive via directly contacts the first conductive line and the doped region.

12. The method of claim 8, wherein the first conductive line is electrically coupled to an electrically conductive bottom plate of the DTC.

13. The method of claim 8, wherein forming the DTC comprises forming more than two conductive DTC plates and forming more than two DTC dielectric layers, wherein the first conductive line is electrically coupled to alternating ones of the conductive DTC plates.

14. The method of claim 13, wherein forming the DTC comprises forming spacers along sidewalls of the conductive DTC plates.

15. The method of claim 14, wherein the spacers are between adjacent ones of the DTC dielectric layers.

16. A method comprising:
forming a recess in a substrate;
forming a doped region in the substrate;
at least partially forming a deep trench capacitor (DTC) in the recess; and
forming an interconnect structure over the DTC and the substrate, wherein forming the interconnect structure comprises:
 forming a first dielectric layer over the substrate;
 forming a first conductive line and a second conductive line in the first dielectric layer;
 forming a first contact pad and a second contact pad, wherein the first conductive line is electrically between the first contact pad and the doped region, wherein the first conductive line is electrically between the first contact pad and the DTC, wherein the second conductive line is electrically between the second contact pad and the DTC, wherein a first portion of the first conductive line is part of a seal ring structure; and
 forming an underbump metallization (UBM) over the first contact pad, wherein forming the UBM comprises performing a sputtering process, wherein an electrical current generated during the sputtering process flows from the UBM through the first conductive line to the doped region.

17. The method of claim 16, wherein forming the interconnect structure comprises forming a third conductive line, wherein the third conductive line is above the first conductive line, wherein the third conductive line is a part of the seal ring structure.

18. The method of claim 16, wherein forming the interconnect structure comprises forming a third conductive line, wherein the third conductive line is below the first conductive line, wherein the third conductive line is part of the seal ring structure.

19. The method of claim 16, wherein the first conductive line and the second conductive line are in a bottommost conductive layer of the interconnect structure.

20. The method of claim 16, wherein forming the interconnect structure further comprises forming a conductive via contacting the doped region, further comprising:
forming a dielectric liner layer over the substrate and in the recess, wherein the DTC is formed on the dielectric liner layer, wherein the conductive via extends through the dielectric liner layer.

* * * * *